(12) United States Patent
Cheng et al.

(10) Patent No.: US 10,541,205 B1
(45) Date of Patent: Jan. 21, 2020

(54) MANUFACTURE OF INTERCONNECTS FOR INTEGRATION OF MULTIPLE INTEGRATED CIRCUITS

(71) Applicant: Intel Corporation, Santa Clara, CA (US)

(72) Inventors: Ning Cheng, San Jose, CA (US); Fangyun Richter, San Jose, CA (US); Andy Louie Lee, San Jose, CA (US)

(73) Assignee: INTEL CORPORATION, Santa Clara, CA (US)

(*) Notice: Subject to any disclaimer, the term of this patent is extended or adjusted under 35 U.S.C. 154(b) by 302 days.

(21) Appl. No.: 15/432,823

(22) Filed: Feb. 14, 2017

(51) Int. Cl.
| | | |
|---|---|---|
| *H01L 23/00* | (2006.01) | |
| *H01L 21/28* | (2006.01) | |
| *H01L 27/115* | (2017.01) | |
| *H01L 23/528* | (2006.01) | |
| *H01L 23/48* | (2006.01) | |
| *H01L 21/768* | (2006.01) | |
| *H01L 21/48* | (2006.01) | |

(52) U.S. Cl.
CPC ...... *H01L 23/5283* (2013.01); *H01L 21/4853* (2013.01); *H01L 21/76898* (2013.01); *H01L 23/481* (2013.01); *H01L 27/115* (2013.01)

(58) Field of Classification Search
CPC ......... H01L 27/11531; H01L 29/66825; H01L 29/0649; H01L 29/42328; H01L 21/30604; H01L 29/40114; H01L 21/7624; H01L 27/11521; H01L 27/11534; H01L 27/1207; H01L 21/7622; H01L 23/5283; H01L 23/48; H01L 21/76898; H01L 21/4853
See application file for complete search history.

(56) References Cited

U.S. PATENT DOCUMENTS

| | | | | |
|---|---|---|---|---|
| 6,841,469 B2 * | 1/2005 | Sawada | ............ | H01L 21/76898 257/622 |
| 6,849,518 B2 * | 2/2005 | Parat | ................ | H01L 21/76229 257/E21.548 |
| 7,129,176 B2 * | 10/2006 | Oohara | ................ | G02B 6/4249 438/696 |
| 7,214,625 B2 * | 5/2007 | Asami | ................ | B81C 1/00619 257/419 |
| 7,314,826 B2 * | 1/2008 | Matsumoto | ....... | H01L 21/76229 257/E21.548 |
| 7,470,981 B2 * | 12/2008 | Egusa | ................... | H01L 23/522 257/700 |
| 7,479,421 B2 * | 1/2009 | Kavalieros | ...... | H01L 21/823431 257/E21.421 |
| 7,491,555 B2 * | 2/2009 | Lehr | ................. | H01L 21/76816 438/14 |
| 8,101,494 B2 * | 1/2012 | Collins | ................. | H01L 23/481 438/386 |

(Continued)

*Primary Examiner* — Savitri Mulpuri
(74) *Attorney, Agent, or Firm* — Fletcher Yoder, P.C.

(57) ABSTRACT

Fabrication methods for monolithic dies that integrate multiple integrated circuits, such as System-on-Chips are described. A substrate having an interconnect may be coupled via electrical terminations to the integrated circuits. Fabrication methods provide multiple electrical termination regions on a surface, with each region having geometrical properties that are appropriate for the coupled integrated circuit. Electrical terminations with different directions may be produced employing a single reactive ion etching process under conditions that enhance micro loading effects during fabrication.

18 Claims, 5 Drawing Sheets

(56) References Cited

U.S. PATENT DOCUMENTS

| | | | |
|---|---|---|---|
| 8,119,489 B2* | 2/2012 | Shih | H01L 27/1052 |
| | | | 257/E21.546 |
| 8,766,279 B1* | 7/2014 | Yen | H01L 29/8725 |
| | | | 257/77 |
| 8,809,196 B2* | 8/2014 | Zin | H01L 21/31116 |
| | | | 438/706 |
| 9,431,407 B2* | 8/2016 | Su | H01L 27/11531 |
| 9,634,020 B1* | 4/2017 | Su | H01L 29/0847 |
| 9,691,684 B2* | 6/2017 | Park | H01L 23/481 |
| 10,170,572 B2* | 1/2019 | Ku | H01L 29/407 |
| 2002/0155676 A1* | 10/2002 | Stetter | H01L 21/768 |
| | | | 438/396 |
| 2013/0147007 A1* | 6/2013 | Booth, Jr. | H01L 27/10829 |
| | | | 257/508 |
| 2013/0248992 A1* | 9/2013 | Padmanabhan | H01L 29/41766 |
| | | | 257/331 |
| 2013/0309838 A1* | 11/2013 | Wei | H01L 21/76229 |
| | | | 438/424 |
| 2015/0028450 A1* | 1/2015 | Park | H01L 23/481 |
| | | | 257/532 |
| 2015/0263040 A1* | 9/2015 | Su | H01L 27/1203 |
| | | | 257/322 |
| 2016/0049509 A1* | 2/2016 | Tomita | H01L 29/7813 |
| | | | 257/331 |
| 2016/0181261 A1* | 6/2016 | Wu | H01L 27/11521 |
| | | | 257/316 |

* cited by examiner

MANUFACTURE OF INTERCONNECTS FOR INTEGRATION OF MULTIPLE INTEGRATED CIRCUITS

BACKGROUND OF THE INVENTION

The present invention relates generally to design and manufacturing methods of circuits that use multiple integrated circuits. Specifically, this disclosure relates to methods and systems for fabrication of interconnect structures with varied dimensions for production of multi-die devices.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it may be understood that these statements are to be read in this light, and not as admissions of prior art.

Many electrical devices may divide the tasks and functionalities across different circuitries, such as programmable logic devices, processors, memory, and other integrated circuits. The multiple integrated circuits may be assembled in a circuit board or mounted to a substrate to form an integrated monolithic die. Monolithic dies may provide improved performance when compared to other systems such as a circuit board, as the customized interconnect structure may provide reduced latency, improved bandwidth, reduced power consumption, elimination or mitigation of dedicated communication circuitry, (e.g., transceivers, serializers, deserializers) and/or less expensive manufacturing. For example, many mobile devices employ a System-on-a-Chip, a monolithic die that may have a microprocessor, a graphics unit, and a network controller, among other integrated circuits.

Monolithic dies having multiple integrated circuits may include an interconnect composed of electrical routes formed in the substrate of the monolithic die. The interconnect may enable communication between the integrated circuits mounted to the substrate and between the integrated circuits and other circuitries coupled to the monolithic die by providing electrical coupling between the various circuitries. In particular, the coupling between the integrated circuits and the interconnect may take place through contacts between integrated circuit terminals and a top metal layer of the interconnect that is exposed in the surface of the substrate.

As different types of integrated circuits may be mounted to different regions of the substrate, each region of the substrate may have different specifications for the top metal layer contacts. Specifications for the contact may include geometrical considerations, such as route density, metal thickness, or contact area. These specifications may be due to differences in power requirements, surface area availability, and delays due to parasitic impedance effects (e.g., resistance-capacitance delays) among other characteristics. For example, a microprocessor IC may be coupled to a region of the top metal layer with higher density of contacts, whereas a programmable logic device may be coupled to a region of the top metal layer with lower density of contacts. The fabrication of top metal layers having multiple regions with different geometrical specifications can be very challenging and, as a result, certain monolithic dies may instead employ compromise solutions using a single geometric specification that prevent maximum performance for the monolithic die. As the clocking speed increase and circuit scale decreases, the performance degradation observed in compromise solutions becomes critical.

SUMMARY

Certain aspects commensurate in scope with the originally claimed invention are set forth below. It should be understood that these aspects are presented merely to provide the reader with a brief summary of certain forms of the invention might take and that these aspects are not intended to limit the scope of the invention. Indeed, the invention may encompass a variety of aspects that may not be set forth below.

In an embodiment, a method to fabricate a monolithic die is described. The method may include steps for covering a surface with an etch mask. The etch mask may include multiple apertures with varying sizes. The method also includes a step for using reactive ion etching to produce trenches in the regions under the apertures. The reactive ion etching process may be performed under conditions that increase micro loading effects, a phenomenon in which the etch rate is proportional to the width of the aperture. As a result, the depth of a wider trench may be larger than the depth of a narrower trench.

In another embodiment, a second method to fabricate the monolithic die is described. The method may include steps for covering a surface of a substrate with an etch mask. The etch mask may have a first region having apertures separated by a first pitch and a second region having apertures separated by a second pitch larger than the first. The method may also include a process for etching the surface of the substrate using reactive ion etching to produce trenches under the apertures in the etch mask. Etching may be performed using reactive ion etching under conditions that enhance micro loading effects. The method also includes a process for filling the trenches with a conductive material to form a first set of electrical terminals in the first region and a second set of electrical terminals in the second region. The first set of electrical terminals may have a thinner metal layer when compared to the second set of electrical terminals.

In another embodiment, a monolithic die is described. The monolithic die may include a substrate having an interconnect. The top metal layer of the interconnect may have a first and a second region having a first and a second set of electrical terminals, respectively. The pitch between the terminals in the second region may be larger than the pitch between the terminals in the first region. Moreover, each terminal in the second region may be wider and thicker than the terminals of the first region. The monolithic die may also include a first integrated circuit coupled to the first set of electrical terminals and second integrated circuit electrically coupled to the second set of electrical terminals. The thickness of the metal layer of the first set of terminals may be determined based on a desired parasitic delay and the pitch between the terminals in the first region. Similarly, the thickness of the metal layer of the second set of terminals may be determined based on a desired parasitic delay and the pitch between the terminals in the second region.

BRIEF DESCRIPTION OF THE DRAWINGS

Advantages of the invention may become apparent upon reading the following detailed description and upon reference to the drawings in which.

DETAILED DESCRIPTION OF SPECIFIC EMBODIMENTS

Figure 1:
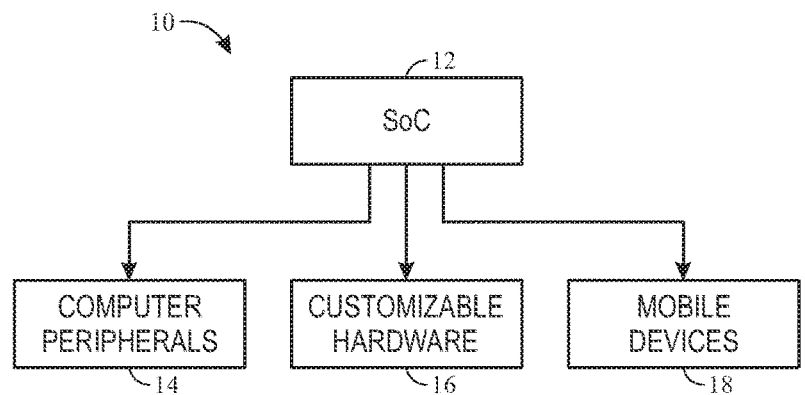
FIG. 1 illustrates electronic devices that may be benefit from a monolithic die System-on-Chip that may be fabricated using methods described herein, in accordance to an embodiment.

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Many electrical devices may employ integrated monolithic dies having multiple integrated circuits (ICs) attached to a substrate. For example, integrated monolithic ICs may integrate processor ICs, memory ICs, sensor and actuator ICs, and other application specific integrated circuits (ASICs) or field-programmable gate arrays (FPGAs) customized to implement functionalities such as communication protocols, data signal processing, graphic processing units or several other functions. For proper integration, an interconnect may provide electrical routing between the multiple ICs mounted to the substrate and between the monolithic die and external electrical devices. The ICs that are part of the monolithic die may be electrically coupled to the interconnect through electrical connectors that may be located in the top metal layer of the substrate.

The electrical connectors in the top metal layer may be formed in regions of the top metal layer destined to receive an IC. Performance of the IC in the monolithic die may be affected by the dimensions and shape of the routes and connectors in the top metal layer of the interconnect. For example, a connector having a thick metal layer may provide a decrease in resistance while a connector region having small spacing between routes (e.g., small pitch) may provide an increase in route density. Embodiments described herein may allow for fabrication of monolithic dies in which the dimensions of the regions of the interconnect may be varied to satisfy particular specifications of different ICs. For example, a system-on-chip (SoC) device having a processor IC and an FPGA may be fabricated to have smaller dimension electrical contacts in the region destined for the processor and larger dimension electrical contacts in the region destined for the FPGA.

Fabrication of the top metal layer of the interconnect may take place by etching trenches into the top of a substrate and filling the trenches with a conductive material. Accordingly, dimensions of the etched trenches may correspond to the dimensions of the electrical contacts and routes in the top layer of the interconnect. One particular etching method that may be used is reactive ion etching. As detailed when discussing FIGS. 6 and 7 below, reactive ion etching is a process that may be susceptible to a phenomenon known as micro loading effect. Due to micro loading effect, variations in the depth of trenches may occur, as further explained below. Usually, homogeneous trenches are desired and, for that purpose, methods may be used to suppress micro loading effects. Embodiments described herein discuss methods in which micro loading effects are enhanced in reactive ion etching.

The enhancement of micro loading effects may be desirable when producing trenches having multiple geometries such as may be the case when fabricating a top metal layer of an interconnect of a monolithic die. Methods that exploit micro loading effects to reduce complexity in the manufacturing process are described herein. Other methods to produce trenches having multiple geometries by having each region of the substrate etched in a separate step are also considered. As detailed below, embodiments described herein may allow a single-step or a multi-step approach for obtaining different regions of the substrate having different dimensions for the interconnect electrical contacts.

With the foregoing in mind, the chart 10 in FIG. 1 illustrates different systems that may employ monolithic dies with multiples ICs, such as SoC 12. A SoC 12 may integrate multiple ICs in a single monolithic die to provide a device capable of several functionalities in an efficient package. For example, a SoC may have an integrated processor, graphical process unit, and a network controller in a single die. The SoC 12 may be used in the production of computer peripherals 14, such as graphic processing units, network adaptors, user interface controllers and other systems that may interface with a general-purpose computer. Customizable hardware 16, such as robots, distributed sensors, actuators, controllers, home automation equipment, and other devices, may also benefit by integrated a SoC 12 as an alternative to multiple integrated circuits mounted to a PCB, as that may increase resilience of the customizable hardware 16. Mobile devices 18 may also include a SoC 12 that may incorporate a processor, memory, and communication ICs, among others, in a compact package. An integrated SoC 12 may be generally used in any electrical device, particularly in systems that may benefit from reduced size, improved reliability, and easier fabrication, among other advantages.

Figure 2:
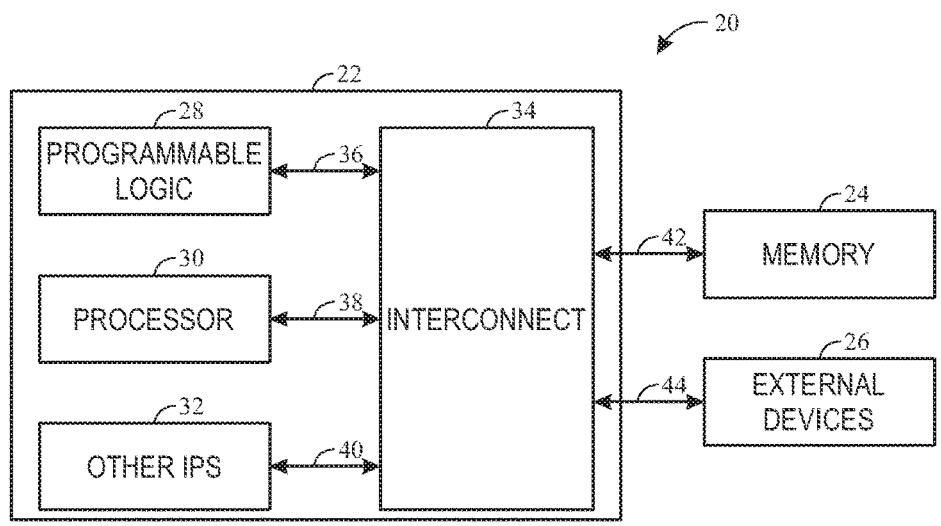
FIG. 2 illustrates of an architecture of a device that includes a monolithic die having multiple integrated circuits coupled via an interconnect, in accordance with an embodiment.

Diagram 20 in FIG. 2 illustrates an electrical device that may have a SoC implemented as monolithic die 22. The monolithic die 22 may be connected to external components such as memory 24 or other electronic devices 26. Moreover, the monolithic die 22 may integrate multiple ICs such as programmable logic device 28 (e.g., FPGA), and microprocessor 30. Other integrated circuits 32, such as communication circuitry, digital signal processing circuitry, protocol circuitry, sensing and control circuitry, power regulators, or other integrated circuits, may also be integrated in monolithic die 22. Note that integrated circuits 32 may be hard intellectual property (HIP) circuitry, circuitry that includes hardened (i.e., hard-wired) logic. HIP circuitry may, for example, include circuitry for handling communication protocols such as Ethernet, Universal Serial Bus (USB), Bluetooth, or any other methods. HIP circuitry may also include user interface controller circuitry or a display controller circuitry.

The ICs of the monolithic die 22 may communicate with the other ICs of the monolithic die 22 or with external devices through an interconnect 34. In the example illustrated in diagram 20, programmable logic device 28 may be coupled to the interconnect 34 through electrical terminals 36 and microprocessor 30 may be coupled to the interconnect 34 through electrical terminals 38. As briefly discussed above and further detailed below, programmable logic device 28 may benefit from electrical terminals 36 formed with thick metal and large pitch (i.e., separation between neighboring routes), while microprocessor 30 may benefit from electrical terminals 40 formed with thin metal and small pitch. Large dimensions in electrical terminal 36 may allow a reduced resistance, which allows for a better power distribution network for chips having larger floorplan, as may be the case for programmable logic devices 28 such as FPGAs. Improved performance may be obtained by having electrical terminals 36 being formed with pitches between 150 μm and 500 μm. By contrast, the small pitch of electrical terminals 40 may be more suitable for a microprocessor 30 as the high density of the electrical connections may provide better coupling with the increased number of terminations of a microprocessor 30. To that end, electrical terminals 40 may have, for example, pitches between 80 μm and 200 μm.

Other integrated circuits 32 may also be coupled to the interconnect 34 via respective electrical terminals 40, in which the geometry of the top metal layer in the coupling region may be adjusted to provide improved performance. Note further that programmable logic 28, microprocessor 30, and the other integrated circuits 32 may also access memory 24 via a connection 42 or other electronic devices 26 via a connection 44. This access to memory 24 or other electronic devices 26 may take place through interconnect 34. It should be noted that, while memory 24 is illustrated as external to monolithic die 22 in this example, this is not a limiting feature as monolithic dies that incorporate memories may also be fabricated.

Figure 3:
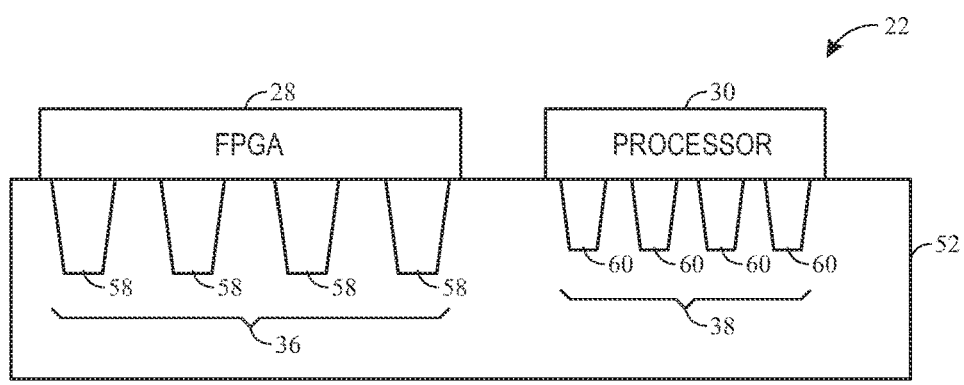
FIG. 3 illustrates of a monolithic die having an FPGA integrated circuit and a microprocessor integrated circuit via a top metal layer of an interconnect, in accordance with an embodiment.

An example of a monolithic die 22 having top metal layer having electrical terminals with varied geometry is illustrated in FIG. 3. A substrate 52 is used to integrate a programmable logic device 28 and a microprocessor 30. The programmable logic device 28 may be coupled to the interconnect (not illustrated) through electrical terminals 36 and the microprocessor 30 may be coupled to the interconnect through electrical terminals 38. Note that the dimensions of each terminal 58 of the electrical terminals 36 may be different from the dimensions of each terminal 60 of the electrical terminals 38. For example, terminals 60, which are coupled to the microprocessor 30, may have a thin metal layer and smaller pitch, resulting in an increased density in electrical terminals 38. As discussed below, this configuration may allow for decreased parasitic delay (e.g., resistance-capacitance delay, RC delay, parasitic inductance delay, etc.) at lower pitch. In contrast, terminals 58 may have a larger pitch and a thicker metal layer, resulting in electrical terminals 36 having decreased resistance and decreased RC delay, as detailed below.

Figure 4:
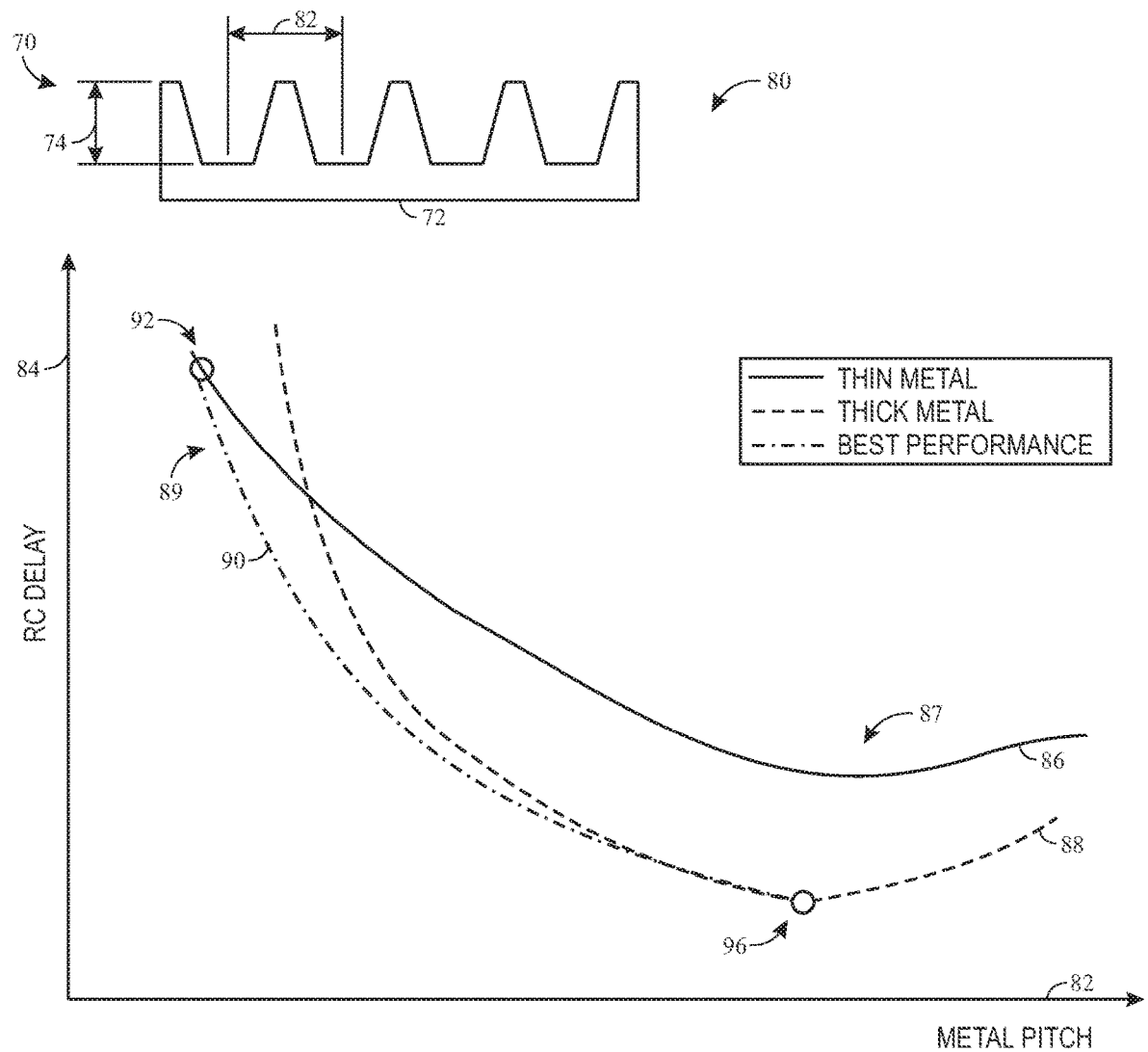
FIG. 4 provides a chart showing the effect of the geometry of electrical contacts in a top metal layer of an interconnect in the resistance-capacitance (RC) delay, in accordance with an embodiment.

As discussed above, the thickness and the pitch of the top metal layer may affect the electrical coupling between the integrated circuits of a monolithic die and the interconnect network. Diagram 70 in FIG. 4 illustrates a top metal layer 72 having a metal thickness 74 and a metal pitch 82, and chart 80 in FIG. 4 provides an illustration of the relation between metal pitch 82 of the top metal layer of an interconnect and the RC delay 84 observed in the interconnect for different metal thickness 74 specifications. The relationship is illustrated for a thin metal electrical connection 86 and for a thick metal electrical connection 88. The plot shows that a thin metal electrical connection 86 will present a larger RC delay 84 than thick metal electrical connection 86 where the metal pitch 82 is larger (region 87). On the other hand, the thin metal electrical connection 86 will present a smaller RC delay 84 than the thick metal electrical connection 86 where the metal pitch 82 is smaller (region 89). A performance curve 90 illustrates a minimum RC delay 84 that may be obtained by an electrical connection when the metal thickness 74 is optimized. If the metal pitch 82 is small (region 89), the RC delay 84 of the performance curve 90 may be achieved by a thin metal electrical connection 86 provides the minimum RC delay 84. For example, for a larger metal pitch 82 in a 150-500 μm range, the metal thickness 74 may be 130-750 μm for reduced RC delay. When the metal pitch 82 is large (region 87), the RC delay 84 of the performance curve 90 is achieved by having a thick metal electrical connection 88. For example, for a smaller metal pitch 82 in the 80-200 μm range, the metal thickness 74 may be 50-220 μm for reduced RC delay.

The pitch and metal thickness of the top metal layer of an interconnect may be selected based on which IC will be coupled to a particular region of the substrate. In certain situations, a smaller metal pitch 82 may be desired as it allows for increased route density and, consequently, the integrated circuit may have a reduced footprint. For example, processors, microcontrollers and some other low power, high-frequency integrated circuits may perform better with smaller metal pitch 82. In such situation, the top metal layer may benefit from a shallow trench in the substrate, to produce a thin metal layer (point 92). In other situations, a larger metal pitch 82 may be preferred. The increased metal pitch 82 allows for wider electrical terminals and routes that presents decreased the parasitic resistance. Examples of situations that benefit from such geometry include ICs with long distance routing, ICs that process analog electrical signals, or ICs that carry high voltage signals. This may also allow for a more efficient power distribution network for chips, particularly in situations where they occupy a larger footprint. Power consumption and heat generation may also decrease due to reduced parasitic resistance. For example, FPGAs may use long distance routing, which may benefit from the lower voltage drop that results from the decreased resistance. In such situation, the large metal pitch 82 terminals may benefit from a deep trench in the substrate, to produce a thick metal layer (point 96).

Figure 5:
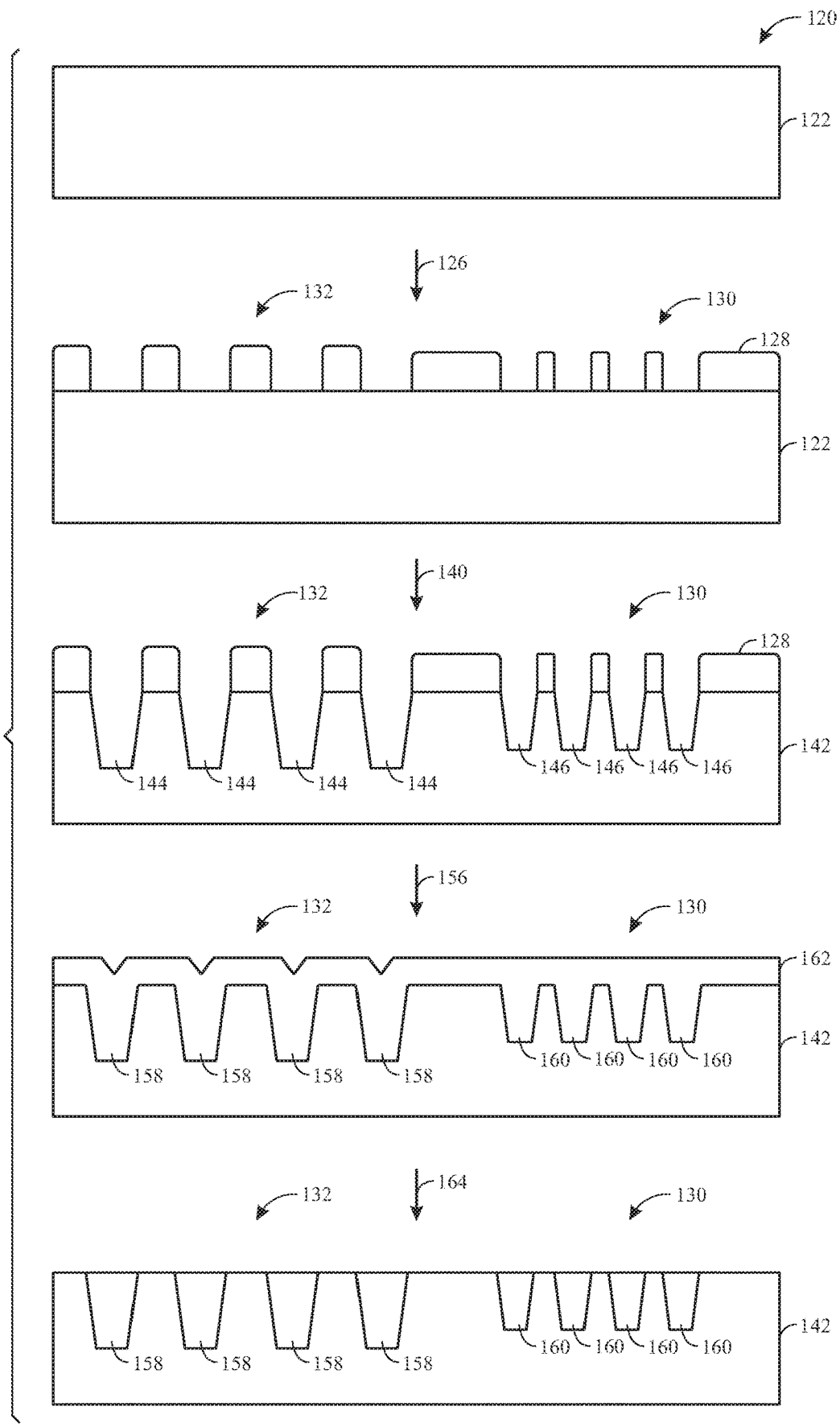
FIG. 5 illustrates of a method for fabrication of an interconnect having a top metal layer with multiple contact regions using enhance micro loading effect reactive ion etching, in accordance with an embodiment.

As discussed above, a monolithic die having an interconnect with top metal layer having multiple regions may be produced employing reactive ion etching. FIG. 5 illustrates a method 120 for producing a monolithic die using a single reactive ion etching process by exploiting micro loading effects to produce top metal layers having distinct dimensions. Method 120 begins with a substrate 122 used for the integration of the monolithic die. Substrate 122 may be silicon, polycrystalline silicon (poly-Si), aluminum, aluminum silicon copper alloy, tungsten, tungsten titanium alloy, tungsten silicate, titanium silicate, cobalt silicate, silicon dioxide, silicon nitrates, and any other substrate amenable to fabrication using reactive ion etching. Substrate 122 may be a single die or a wafer. In a process 126, a protective mask 128 may be attached to or formed on the surface of the substrate 122. The mask 128 may be formed by photoresist material placed through a photolithography process. The mask 128 may alternatively be formed using an oxide mask or any other masking process appropriate for this type of fabrication. Note that mask 128 may have a small pitch region 130, which may be used to form a top metal layer having small pitch and a thin metal layer. Mask 128 may also have a large pitch region 132, which may be used to form a top metal layer having a large pitch and a thick metal layer. Apertures in the small pitch region 130 are smaller than aperture in the large pitch region 132, which may lead to micro loading effects during etching. For example, apertures in the small pitch region 130 may have a width between 80 μm and 200 μm and apertures in the large pitch region 132 may have a width between 150 μm and 500 μm.

A reactive ion etching process 140 may be used to open trenches in regions 130 and 132 that are not protected by mask 128. This process 140 may produce etched substrate 142. To perform the reactive ion etching process 140, substrate 142 and mask 128 may be placed in an etching chamber in which pressure, temperature and gas concentration and composition may be adjusted. The pressure in the chamber may be reduced to form a plasma with the gases in the chamber, and release certain free ions, also known as etching radicals. For example, in silicon etching, tetrafluoromethane gas may be placed in the chamber to produce a plasma containing free fluorine ions. Charged plates may be disposed in the etching chamber to generate a strong electric field that may be aligned perpendicular to the surface of the substrate 142. These electric fields may accelerate etching radicals towards the surface of the substrate 142. Upon collision between etching radicals and the surface of substrate 142, material may be removed from regions of the substrate surface that are not protected by mask 128 resulting in the production of trenches. Removal of material from unprotected regions of large pitch region 132 form trenches 144, whereas removal of material from unprotected regions of small pitch region 130 form trenches 146.

As discussed above, the thickness of the metal layer in different regions of the top metal layer of the substrate may be adjusted using micro loading effects. Usually, the etch rate obtained during reactive ion etching may be proportional to the duration of the etching process, concentration of etch radicals, chamber pressure, and electric fields among other parameters. Furthermore, due micro loading effects, the etch rate may depend on the aperture in etching mask or the aspect ratio of the trench, as detailed below. As a result, micro loading effects may lead to a reduced etch rate in regions with smaller pitch. Usually, micro loading effects are undesirable as they may produce unintended variations in the depth of a trench. However, in method 100, the micro loading effect may be beneficial, as it is desirable to produce trenches that are deeper in regions having larger pitch.

Accordingly, it may be useful to provide conditions during reactive ion etching that enhance micro loading effects. Micro loading effect may be caused by an increase in the transit difficulty for the etching radicals passing through narrow apertures and/or the difficulty for etch byproducts to diffuse out of the etched surface through narrow apertures. As a result of micro loading effects, multiple regions of the substrate may have distinct etch rates. While the specific etch rates may vary based on the conditions of the etching chamber and/or parameters of the etch process, micro loading effects may lead to etch rates that increase as dimensions of an aperture also increases. For example, a reactive ion etching process may be set up such that a region having small apertures may present an etch rate in the 5-25 nm/s range and a region having large apertures may present an etch rate in the 15-40 nm/s range during a reactive ion etching process 140. As such micro loading effects may be tuned by adjustment of parameters in the etching chamber such as gas pressure, temperature, etching radical concentrations, sidewall scattering, and other parameters of the process to increase those effects. For example, increase in pressure, decrease in gas flow, increase in concentration of etching radicals, decrease of the expected mean free path of the etching radicals by adjustment of the electric field, increase in temperature and other changes to conditions may be used to enhance the micro loading effect.

Following the reactive ion etching process 140 to produce trenches 144 and 146, the trenches may be filled by stripping the photoresist 128 and adding a conductive material 162 (process 156). Trenches 144 may be filled by conductive material 162 to produce a conductive layer having large pitch terminals 158 in region 132 and trenches 146 may be filled with the conductive material 162 to produce a conductive layer having small pitch terminals 160. The conductive material 162 may be copper, some other conductive metal or metal alloy, or any other material that can be placed in the surface of substrate 142 via electroplating or some other method. A further process 164 may be used to strip any conductive material 162 in excess, and to expose the top metal layers in regions 130 and 132. Substrate 142 may be used to produce a monolithic die having a small pitch region 130 with a thin metal layer, and a large pitch region 132 with a thick metal layer. ICs such as microprocessor 30, programmable logic devices 28, or other circuits 32 may be attached in the region having top metal surface appropriate to its electrical characteristics, as discussed above with reference to FIG. 3.

Figure 6:
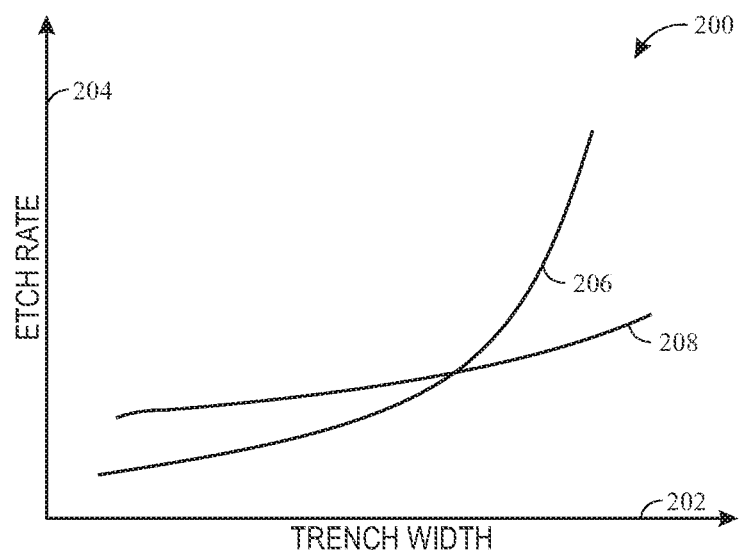
FIG. 6 provides a chart showing the effect of trench width on the etch rate due to micro loading effects on reactive ion etching processes, in accordance with an embodiment.

As described above, enhancement of micro loading effects may be beneficial as they allow for the pitch of the electrical termination to be proportional to the thickness of the metal layer. Chart 200 in FIG. 6 illustrates micro loading effects during reactive ion etching by illustrating the relationship between trench width 202 and the etch rate 204. Etching in enhanced micro loading conditions (curve 206) is compared with etching in suppressed micro loading conditions (curve 208). In enhanced micro loading conditions, larger the trench width 202 lead to substantially higher the etch rate 204, as seen in curve 206. Consequently, in conditions that enhance micro loading, wider trenches may also be deeper. Since regions in the surface of the substrate with larger pitches will generate wider trenches, large pitched regions will also have thicker metal layers. Conversely, small pitched regions may have thin metal layers in conditions that enhance micro loading. By contrast, if micro loading effects are suppressed the etch rate does not depend substantially on the width of the trench as seen in curve 208. As a result, the thickness of the resulting metal layer does not depend on the pitch of the metal layer in those regions.

Figure 7:
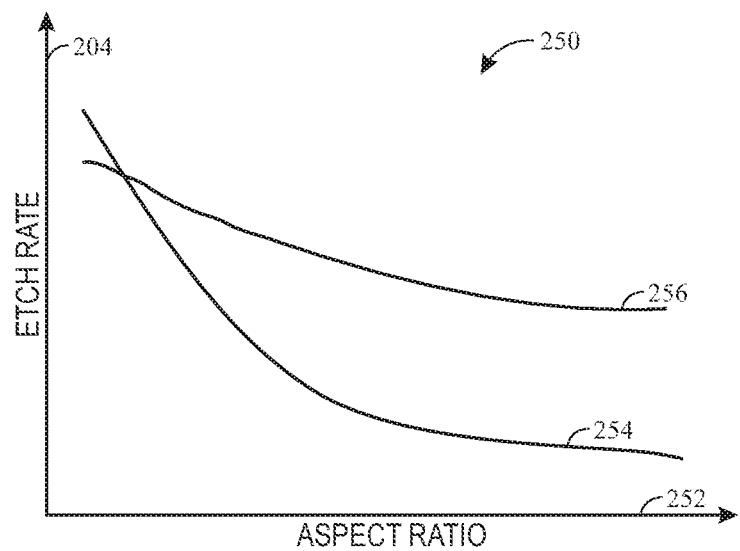
FIG. 7 provides a chart showing the effect of trench aspect ratio on the etch rate due to micro loading effects during ion etching processes, in accordance with an embodiment.

Chart 250 of FIG. 7 illustrates the effect of enhancing the micro loading effects with respect to the aspect ratio 252 of a trench produced employing a reactive ion etching process. Aspect ratio 252 refers to the ratio between the depth of a trench and the aperture in the etch mask. As discussed previously, reduction in an aperture of the etch mask may lead to a reduction in the etch rate 204 due to micro loading effects. This may be explained by the fact that, as the aspect ratio 252 of a trench increases the etch rate 204 decreases. Curve 254 illustrates a situation in which the micro loading effect is enhanced, whereas curve 256 illustrates a situation in which the micro loading effect is suppressed. Note that the etch rate 204 dependency on trench aspect ratio 252 is stronger in a situation in which micro loading effect is enhanced (curve 254) compared to a suppressed micro loading situation (curve 256).

Figure 8:
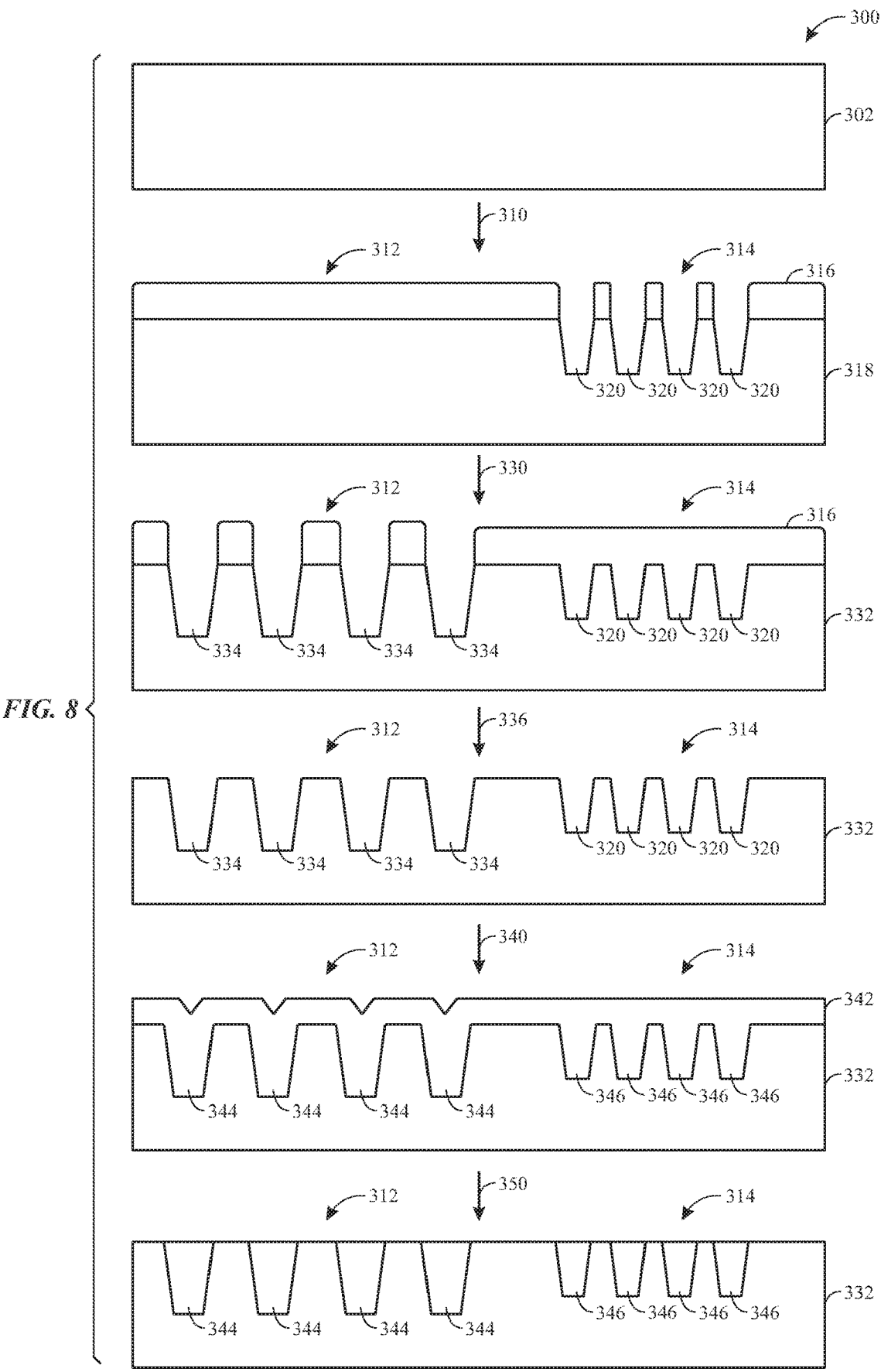
FIG. 8 illustrates a method for fabrication of an interconnect having a top metal layer with multiple contact regions using multiple reactive ion etching processes, in accordance with an embodiment.

While method 120 described a single-step reactive-ion etching process, it may be possible to produce a substrate having top metal layers with varied dimensions by employing a multiple reactive ion etching processes. Method 300 in FIG. 8 illustrates a process in which multiple reactive ion etching processes are performed with different masks applied on the substrate. A substrate 302 may undergo a first reactive ion process 310. The first process may, for example, preserve region 312 while allowing for trenches in region 314 using an appropriate etch mask 316 placed above substrate 302. Etch mask 316 may completely protect region 312 of substrate 318 from etching by covering the entire surface of the region 312. Etch mask 316 may have openings in the region 314 in the regions where trenches 320 are located. Following the first reactive ion etching process 310, a second reactive ion etching process 330 may take place to produce substrate 332 with etch mask 333. In the second reactive ion etching process, trenches 334 in region 312 of substrate 332 are opened while the previously produced trenches 320 in region 314 are protected by etch mask 334. Note that the apertures in etch mask 333 are wider than the apertures in mask 316, which results in a region 312 having large pitch trenches 334 and region 314 small pitch trenches 320. Further, as discussed above, it may be beneficial to have the wide pitch trenches 334 with a thicker metal layer. To that end, the second reactive ion etching process 330 may be adjusted to produce deeper trenches in comparison to the first reactive ion etching process 310.

Following the second reactive ion etching process 330, the etch mask 333 may be removed to prepare substrate 332 for receiving conductive paste (process 336). Application of a conductive material 342 such as a metal or a paste on the surface of substrate 332 (processes 340) may fill trenches 334 and 320 to produce top metal layers 344 and 346. Removal of excess of the conductive material 342 from the surface of substrate 332 (process 350) prepares the substrate to receive the appropriate ICs. As an example, a microprocessor IC may be electrically coupled to region 314 and a programmable logic device may be electrically coupled to region 312.

Note that the reactive ion etching under micro loading enhancing conditions may be used in other situations. For example, certain micro and nanomechanical devices and certain micro and nanofluidic devices may use reactive ion etching in their fabrication. For example, reactive ion etching may be used to produce chambers, channels and other features in a substrate. In those systems, the use of micro loading enhancing conditions may be used to reduce the number of reactive ion etching processes in a similar way as described above, with respect to methods 120 and 300. Moreover, as discussed above, the extent of the micro loading effect may be tuned based on the parameters of the reactive ion etching chamber. This tuning may be further exploited to decrease the number of steps in the fabrication process as well.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A method comprising:
covering a surface of a substrate with an etch mask, wherein the etch mask comprises a first aperture having a first width and a second aperture having a second width larger than the first width;
etching the surface of the substrate using a reactive ion etching process to produce a first trench under the first aperture and a second trench under the second aperture, wherein the etching comprises:
etching the surface of the substrate to produce a first plurality of trenches that comprises the first trench, wherein the first plurality of trenches comprises a first pitch; and
etching the surface of the substrate to produce a second plurality of trenches that comprises the second trench, wherein the second plurality of trenches comprises a second pitch larger than the first pitch;
filling the first trench to form a first electrical terminal and the second trench to form a second electrical terminal with a conductive layer to form a top metal layer of the substrate;
electrically coupling a first integrated circuit to the first electrical terminal; and
electrically coupling a second integrated circuit to the second electrical terminal, wherein the first integrated circuit is different from the second integrated circuit, wherin the first integrated circuit and second integrated circuit are part of system-on-chip, and wherein the reactive ion etching process is performed under enhanced micro loading effect conditions, and wherein a first depth of the first trench is smaller than a second depth of the second trench due to the enhanced micro loading effect conditions.

2. The method of claim 1, wherein the enhanced micro loading effect conditions comprise increased pressure, decreased gas flow, increased electric field, or increased temperature, or any combination thereof.

3. The method of claim 1, wherein the enhanced micro loading effect conditions cause a decrease in transit of etching radicals of the reactive ion etching process through the first aperture relative to a transit of etching radicals through the second aperture.

4. The method of claim 1, wherein the enhanced micro loading effect conditions cause a decrease in diffusion of etch byproducts of the reactive ion etching process through the first aperture relative to a diffusion of etch byproducts through the second aperture.

5. The method of claim 4, wherein the first aperture has a width between 150-500 μm and the second aperture has a width between 80-200 μm.

6. The method of claim 1, wherein the enhanced micro loading effect conditions causes an etch rate of the first trench to be between 5-25 nm/s and an etch rate of the second trench to be between 15-40 nm/s.

7. The method of claim 1, wherein the first pitch is larger than 80 µm and smaller than 200 µm, and wherein the second pitch is larger than 150 µm and smaller than 500 µm.

8. The method of claim 1, wherein the first integrated circuit comprises a microprocessor and the second integrated circuit comprises a programmable logic device.

9. A method comprising:
covering a surface of a substrate with an etch mask, the etch mask comprising:
a first region comprising a plurality of apertures separated by a first pitch; and
a second region comprising a second plurality of apertures separated by a second pitch that is larger than the first pitch;
etching the surface of the substrate using a reactive ion etching process to produce a first region of the substrate having a first set of trenches separated by the first pitch and a second region of the substrate having a second set of trenches separated by the second pitch, wherein the reactive ion etching process is performed under enhanced micro loading effect conditions;
filling the first set of trenches with a conductive material to form a first set of terminals;
filling the second set of trenches with the conductive material to form a second set of terminals, wherein a metal thickness of the second set of terminals is larger than the metal thickness of the first set of terminals;
attaching a microprocessor coupled to the first set of terminals in the first region of the substrate; and
attaching a field-programmable gate array coupled to the second set of terminals in the second region of the substrate.

10. The method of claim 9, wherein the enhanced micro loading effect conditions comprise increased pressure, decreased gas flow, increased electric field, or increased temperature, or any combination thereof.

11. The method of claim 9, wherein the field-programmable gate array comprises a hard intellectual property (HIP) circuitry.

12. The method of claim 11, wherein the HIP circuitry comprises a communication circuitry, user interface circuitry, display circuitry, or any combination thereof.

13. The method of claim 9, wherein the method coupling an interconnect of the substrate to a memory device.

14. A method to manufacturing of an electronic device, comprising:
forming a monolithic die;
attaching the monolithic die comprising a processor and a programmable logic device to a printed circuit board; and
disposing the printed circuit board in an enclosure of the electronic device;
wherein forming the monolithic die comprises:
covering a surface of a substrate with an etch mask, the etch mask comprising a first region comprising a plurality of apertures separated by a first pitch and a second region comprising a second plurality of apertures separated by a second pitch that is larger than the first pitch;
etching the surface of the substrate using a reactive ion etching process to produce a first region of the substrate having a first set of trenches separated by the first pitch and a second region of the substrate having a second set of trenches separated by the second pitch, wherein the reactive ion etching process is performed under enhanced micro loading effect conditions;
filling the first set of trenches with a conductive material to form a first set of terminals;
filling the second set of trenches with a conductive material to form a second set of terminals, wherein a metal thickness of the second set of terminals is larger than the metal thickness of the first set of terminals;
attaching the processor coupled to the first set of terminals in the first region of the substrate; and
attaching the programmable logic device coupled to the second set of terminals in the second region of the substrate.

15. The method of claim 14, comprising attaching a memory device to the printed circuit board, wherein the memory device is electrically coupled to the monolithic die.

16. The method of claim 14, comprising:
attaching a user input device electrically coupled to the monolithic die; and
attaching a display electrically coupled to the monolithic die.

17. The method of claim 14, wherein the monolithic die comprises a system-on-chip.

18. A method comprising:
covering a surface of a substrate with a first etch mask, wherein the first etch mask comprises a first aperture having a first width located in a first region of the surface of the substrate;
etching the surface of the substrate to produce a first trench under the first aperture, wherein etching the surface of the substrate to produce the first trench comprises etching the surface of the substrate to produce a first plurality of trenches that comprises the first trench, wherein the first plurality of trenches comprises a first pitch;
covering the surface of the substrate with a second etch mask, wherein the second etch mask comprises a second aperture having a second width larger than the first width, the second aperture located in a second region of the surface of the substrate;
etching the surface of the substrate to produce a second trench under the second aperture, wherein a depth of the second trench is larger than a depth of the first trench, wherein etching the surface of the substrate to produce the second trench comprises etching the surface of the substrate to produce a second plurality of trenches that comprises the second trench, wherein the second plurality of trenches comprises a second pitch;
coupling a microprocessor in the first region; and
coupling a programmable logic device in the second region of the substrate.

* * * * *